(12) United States Patent
Hamada et al.

(10) Patent No.: US 7,564,133 B2
(45) Date of Patent: Jul. 21, 2009

(54) SEMICONDUCTOR DEVICE AND METHOD FOR FABRICATING THE SAME

(75) Inventors: Masakazu Hamada, Osaka (JP); Kazuyoshi Maekawa, Tokyo (JP); Kenichi Mori, Tokyo (JP)

(73) Assignees: Panasonic Corporation, Osaka (JP); Renesas Technology, Corp., Tokyo (JP)

( * ) Notice: Subject to any disclaimer, the term of this patent is extended or adjusted under 35 U.S.C. 154(b) by 108 days.

(21) Appl. No.: 11/396,645

(22) Filed: Apr. 4, 2006

(65) Prior Publication Data
US 2006/0223325 A1  Oct. 5, 2006

(30) Foreign Application Priority Data
Apr. 4, 2005  (JP) .................. 2005-107190

(51) Int. Cl.
*H01L 23/40* (2006.01)
(52) U.S. Cl. .............. 257/750; 257/751; 438/700
(58) Field of Classification Search ............. 257/750; 438/700
See application file for complete search history.

(56) References Cited

U.S. PATENT DOCUMENTS

| | | | | |
|---|---|---|---|---|
| 5,925,902 A | * | 7/1999 | Sakura | 257/280 |
| 6,001,415 A | * | 12/1999 | Nogami et al. | 216/18 |
| 6,489,233 B2 | * | 12/2002 | Chooi et al. | 438/637 |
| 2004/0000716 A1 | * | 1/2004 | Sakai et al. | 257/758 |
| 2005/0252765 A1 | * | 11/2005 | Zhang et al. | 204/298.03 |

FOREIGN PATENT DOCUMENTS

JP  7-292474 A  11/1995

* cited by examiner

*Primary Examiner*—Shamim Ahmed
(74) *Attorney, Agent, or Firm*—McDermott Will & Emery LLP

(57) ABSTRACT

A semiconductor device comprises: a lower interconnect formed over a semiconductor substrate; an insulating film formed on the lower interconnect; a via hole penetrating the insulating film to reach the lower interconnect; a first barrier film covering bottom and side surfaces of the via hole; and a metal film filling the via hole covered with the first barrier film. A portion of the first barrier film covering a lower end of the side surface of the via hole is thicker than a portion covering the bottom surface of the via hole.

7 Claims, 6 Drawing Sheets

SEMICONDUCTOR DEVICE AND METHOD FOR FABRICATING THE SAME

CROSS-REFERENCE TO RELATED APPLICATIONS

This application claims priority under 35 U.S.C. § 119 on Patent Application No. 2005-107190 filed in Japan on Apr. 4, 2005, the entire contents of which are hereby incorporated by reference.

BACKGROUND OF THE INVENTION (a) Fields of the Invention

The present invention relates to semiconductor devices having barrier films and their fabrication methods.

(b) Description of Related Art

In recent years, semiconductor integrated circuit devices have had higher packing densities, more enhanced functionalities, and faster processing speed. With such a trend, metal interconnects of the devices have also become increasingly finer, and thereby interconnect grooves and via holes for forming the metal interconnects have had higher aspect ratios. In general, in forming the metal interconnect, a barrier film is provided which serves to prevent metal diffusion into an insulating film. As a method for certainly forming the barrier film even in a lower region of the interconnect groove or the via hole with a high aspect ratio, use is made of a sputtering technique with high directivity.

A conventional semiconductor device with a barrier film (see, for example, Japanese Unexamined Patent Publication No. H7-292474) will now be described below.

FIG. 8 is a sectional view of the conventional semiconductor device with a barrier film. Referring to FIG. 8, the conventional semiconductor device with a barrier film has an insulating film 400 formed on a lower interconnect 403 provided over a semiconductor substrate (not shown). The insulating film 400 includes: a metal diffusion prevention film 402 for preventing diffusion of metal from the lower interconnect 403; and a low dielectric constant film 401. The insulating film 400 is provided with an interconnect groove, and the bottom surface of the interconnect groove is provided with a via hole which penetrates the insulating film 400 to expose the lower interconnect 403. A barrier film 405A is formed on bottom and side surfaces of the interconnect groove and bottom and side surfaces of the via hole, and the interconnect groove and the via hole covered with the barrier film 405A are filled with a metal film 405B. An upper interconnect 406 is formed integrally with a via plug 407 for electrically connecting the upper interconnect 406 to the lower interconnect 403. Sputtering with high directivity is employed in forming the barrier film 405A, which allows formation of the barrier film 405A with a sufficient thickness even in a lower region of the high-aspect-ratio via hole.

The conventional semiconductor device with a barrier film, however, has the following problems. In the case where the barrier film 405A is formed by sputtering with high directivity like the conventional example, the thickness $T_{21}$ of a portion of the barrier film 405A covering the side surface of the via hole is smaller than the thickness $T_{22}$ of a portion thereof covering the bottom surface of the via hole. Since the lower interconnect 403 differs greatly from the insulating film 400 in thermal expansivity, application of heat during a fabrication process or an actual use of the semiconductor device applies a large physical stress to the interface between the lower interconnect 403 and the insulating film 400. Then, such a large stress application disadvantageously causes damages to the barrier film 405A because the portion of the barrier film 405A located on the side surface of the via plug 407 is thin. Furthermore, a large stress is also applied to the metal film 405B filling the space surrounded with the barrier film 405A, which disadvantageously induces stress migration to create a void in the metal film 405B.

In general, in order to decrease the contact resistance between the via plug 407 and the lower interconnect 403, an approach is taken in which the bottom surface of the via plug 407 is formed 5 to 100 nm below the interface between the lower interconnect 403 and the insulating film 400 and thus the contact area of the via plug 407 with the lower interconnect 403 is increased. In this approach, if the barrier film 405A is thinner on the side surface of the via plug 407 than on the bottom surface of the via plug 407, an electric field is concentrated on the side surface of the via plug 407 on which the barrier film 405A is thin and has a small resistance. As a result of this, a large current flows through the minute area, which disadvantageously causes damages to the barrier film 405A or electromigration (EM) in the metal film 405B to create a void.

Also in the upper interconnect 406, the barrier film 405A is thinner on the side surface of the upper interconnect 406 than on the bottom surface of the upper interconnect 406. By this structure, if miniaturization of the device significantly reduces the distance between adjacent interconnects, an electric field will be concentrated on the side surface of the upper interconnect 406 with a low resistance. This creates an abnormal current path between the adjacent upper interconnects. As a result of this, electromigration disadvantageously occurs in the metal film 405B of the upper interconnect 406 to shorten the life of the semiconductor device.

SUMMARY OF THE INVENTION

An object of the present invention is to solve the conventional problems described above, and to provide a long-lasting, highly-reliable semiconductor device and its fabricating method by preventing interconnects and via plugs from being damaged due to electric field concentration and physical stress.

To attain the above object, the present invention is designed to provide a semiconductor device in which a barrier film of a metal interconnect is thicker on the side surface of an interconnect groove than on the bottom surface thereof.

To be more specific, a first semiconductor device according to the present invention is characterized by comprising: a lower interconnect formed over a semiconductor substrate; an insulating film formed on the lower interconnect; a via hole penetrating the insulating film to reach the lower interconnect; a first barrier film covering bottom and side surfaces of the via hole; and a metal film filling the via hole covered with the first barrier film. This device is also characterized in that a portion of the first barrier film covering a lower end of the side surface of the via hole is thicker than a portion thereof covering the bottom surface of the via hole.

With the first semiconductor device, an electric field is dispersed over the bottom surface of the via hole, which allows preventing concentration of the electric field on the lower end of the side surface of the via hole. As a result, degradation of a via plug due to electromigration can be prevented.

Preferably, in the first semiconductor device, a portion of the first barrier film covering a region of the side surface of the via hole located below the interface between the insulating film and the lower interconnect is thicker than the portion thereof covering the bottom surface of the via hole. With this structure, an electric field is dispersed over the bottom surface of the via hole. This allows preventing electric field concentration on the region of the side surface of the via hole located below the interface between the insulating film and the lower interconnect, and thereby preventing damages to the via plug due to physical stress.

Preferably, a first semiconductor device further comprises: an interconnect groove which is provided in an upper portion of the insulating film and on the bottom surface of which an opening end of the via hole is positioned; a second barrier film covering bottom and side surfaces of the interconnect groove; and a second metal film filling the interconnect groove covered with the second barrier film. Preferably, in this case, a portion of the second barrier film covering the side surface of the interconnect groove is thicker than the portion thereof covering the bottom surface of the interconnect groove. Such a structure can increase the breakdown voltage of the side surface of the interconnect groove to allow preventing damages to the barrier film on the side surface of the interconnect groove and resulting metal diffusion.

Preferably, in the first semiconductor device, the first and second barrier films are integrally formed of the same material, and the first and second metal films are integrally formed of the same material.

Preferably, in the first semiconductor device, the insulating film includes: a diffusion-prevention insulating film formed on the lower interconnect; and a low dielectric constant film formed on the diffusion-prevention insulating film, and a portion of the first barrier film covering a region of the side surface of the via hole located below the interface between the diffusion-prevention insulating film and the low dielectric constant film is thicker than the portion thereof covering the bottom surface of the via hole. Such a structure can prevent damages to the first barrier film due to stress generated between the diffusion prevention film and the low dielectric constant film. Moreover, the first barrier film has the tapered shape on the bottom surface of the via hole, so that formation of a seed layer for growing the metal film is facilitated.

A second semiconductor device according to the present invention is characterized by comprising: an insulating film formed over a semiconductor substrate; an interconnect groove formed in the insulating film; a barrier film covering bottom and side surfaces of the interconnect groove; and a metal film filling the interconnect groove covered with the barrier film. This device is also characterized in that a portion of the barrier film covering the side surface of the interconnect groove is thicker than a portion thereof covering the bottom surface of the interconnect groove.

With the second semiconductor device, the breakdown voltage of the side surface of the interconnect groove rises. Therefore, if adjacent interconnects are provided, the occurrence of leakage between the interconnects can be prevented. This allows preventing damages to the barrier film due to electric field concentration and preventing resulting diffusion of metal materials into the insulating film.

A third semiconductor device according to the present invention is characterized by comprising: a lower interconnect formed over a semiconductor substrate; an insulating film formed on the lower interconnect; a via hole penetrating the insulating film to reach the lower interconnect; a barrier film covering bottom and side surfaces of the via hole; and a metal film filling the via hole covered with the barrier film. This device is also characterized in that the bottom surface of the via hole is positioned below the interface between the lower interconnect and the insulating film, and the top surface of a portion of the barrier film covering the bottom surface of the via hole is positioned above the interface between the lower interconnect and the insulating film.

With the third semiconductor device, no thin portion of the barrier film is present in an area where the via plug is in contact with the lower interconnect. Therefore, electric field concentration is eliminated on the side surface of the via plug, which allows preventing degradation of the via plug due to electric field concentration. Also, resistance to physical stress is enhanced.

Preferably, in the third semiconductor device, a portion of the barrier film covering a lower end of the side surface of the via hole is thicker than a portion thereof covering the bottom surface of the via hole. With this structure, formation of a seed layer is facilitated.

A method for fabricating a semiconductor device according to the present invention is characterized by comprising: the step (a) of forming a lower interconnect over a semiconductor substrate; the step (b) of forming an insulating film on the lower interconnect; the step (c) of forming a via hole penetrating the insulating film to reach the lower interconnect; the step (d) of forming a first barrier film covering bottom and side surfaces of the via hole; and the step (e) of forming, after the step (d), a metal film filling the via hole. This method is also characterized in that in the step (d), the first barrier film is formed to have a thickness greater in a portion covering a lower end of the side surface of the via hole than in a portion covering the bottom surface of the via hole.

With the method for fabricating a semiconductor device according to the present invention, electric field concentration on the lower end of the side surface of the via hole can be prevented, which provides a semiconductor device suffering little degradation of the via plug due to electromigration.

Preferably, in the fabrication method according to the present invention, in the step (d), the first barrier film is formed to have a thickness greater in a portion covering a region of the side surface of the via hole located below the interface between the lower interconnect and the insulating film than in a portion covering the bottom surface of the via hole. This method allows preventing electric field concentration on the region of the side surface of the via hole located below the interface between the insulating film and the lower interconnect. Also, resistance to physical stress is enhanced.

Preferably, the method for fabricating a semiconductor device according to the present invention further comprises, after the step (b) and before the step (d), the step (f) of forming an interconnect groove in an upper portion of the insulating film, the interconnect groove having a bottom surface where an opening end of the via hole is positioned. Preferably, in the step (d), a second barrier film is formed which covers bottom and side surfaces of the interconnect groove and which is made of the same material as and structured integrally with the first barrier film, and in the step (e), the interconnect groove is filled with a second metal film made of the same material as and structured integrally with the first barrier film.

Preferably, in the above case, in the step (d), the second barrier film is formed to have a thickness greater in a portion covering the side surface of the interconnect groove than in a portion covering the bottom surface of the interconnect groove. This method enhances the breakdown voltage of the side surface of the interconnect groove.

Preferably, in the method for fabricating a semiconductor device according to the present invention, the step (b) includes the substeps of: forming a diffusion prevention film, which is for preventing metal diffusion, on the lower interconnect; and forming a low dielectric constant film on the diffusion prevention film, and in the step (d), the first barrier film is formed to have a thickness greater in a portion covering a region of the side surface of the via hole located below the interface between the diffusion prevention film and the low dielectric constant film than the portion thereof covering the bottom surface of the via hole. This method allows preventing damages to the first barrier film due to stress generated between the diffusion prevention film and the low dielectric constant film. Also, formation of a seed layer is facilitated.

Preferably, in the method for fabricating a semiconductor device according to the present invention, the step (d) is carried out using resputtering. With this method, the portion of the first barrier film covering the lower end of the side surface of the via hole can be certainly made thicker than the portion thereof covering the bottom surface of the via hole.

BEST MODE FOR CARRYING OUT THE INVENTION

FIRST EMBODIMENT

Figure 1:
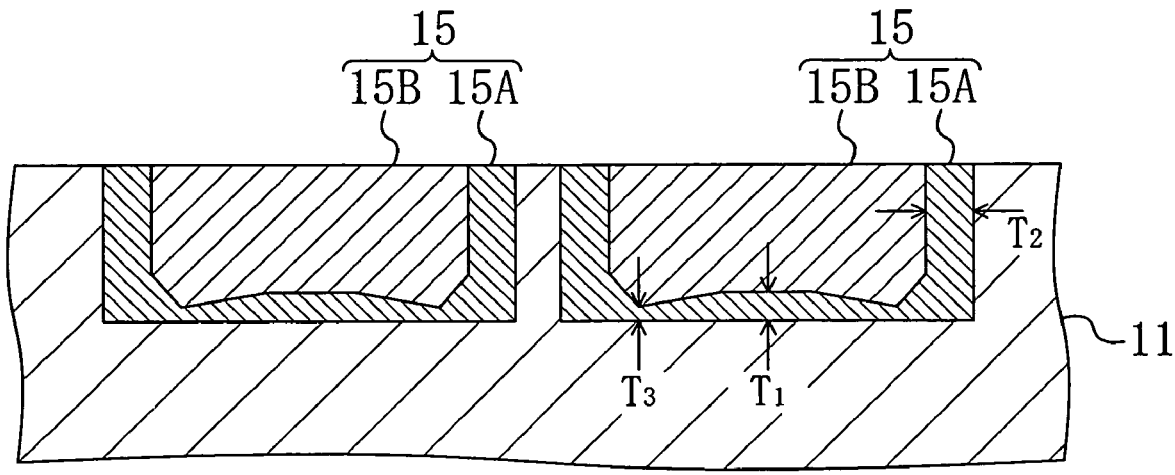
FIG. 1 is a sectional view showing a semiconductor device according to a first embodiment of the present invention.

A semiconductor device according to a first embodiment of the present invention will be described with reference to the accompanying drawings. FIG. 1 shows a cross-sectional structure of the semiconductor device with a barrier film according to the first embodiment. Referring to FIG. 1, a low dielectric constant film 11 of carbon-containing silicon oxide (SiOC) is formed over a semiconductor substrate (not shown). Bottom and side surfaces of an interconnect groove provided in the low dielectric constant film 11 are covered with a barrier film 15A of tantalum (Ta). The interconnect groove covered with the barrier film 15A is filled with a metal film 15B of copper (Cu). The low dielectric constant film 11 is provided with a plurality of interconnect grooves, and formed with a plurality of metal interconnects 15 each composed of the barrier film 15A and the metal film 15B.

In the first embodiment, in a portion of the barrier film 15A covering the bottom surface of the interconnect groove, the thickness $T_1$ of the center portion is 10 nm, and the thickness $T_1$ is greater than the thickness $T_3$ of the corner portion thereof. The thickness $T_2$ of a portion of the barrier film 15A covering the side surface of the interconnect groove is 20 nm.

As shown above, the thickness $T_2$ of the portion of the barrier film 15A covering the side surface of the interconnect groove is made larger than the thicknesses $T_1$ and $T_3$ of the portions of the barrier film 15A covering the bottom surface of the interconnect groove, whereby an electric field generated by passing a current through the metal interconnect 15 is dispersed over the bottom surface of the metal interconnect 15 on which the thin barrier film 15A is provided. Thus, the breakdown voltage between the adjacent metal interconnects 15 is increased, which allows preventing damages to the barrier film 15A and resultant diffusion of Cu into the low dielectric constant film 11.

In the first embodiment, Ta is used for the barrier film 15A. Alternatively, use may be made of a film of tantalum nitride (TaN), titanium (Ti), or titanium nitride (TiN), a stacked film of Ta and TaN, a stacked film of Ti and TiN, or the like. In addition, Cu is used for the metal film 15B, and alternatively silver (Ag), tungsten (W), or the like can also be used therefor.

SECOND EMBODIMENT

Figure 2:
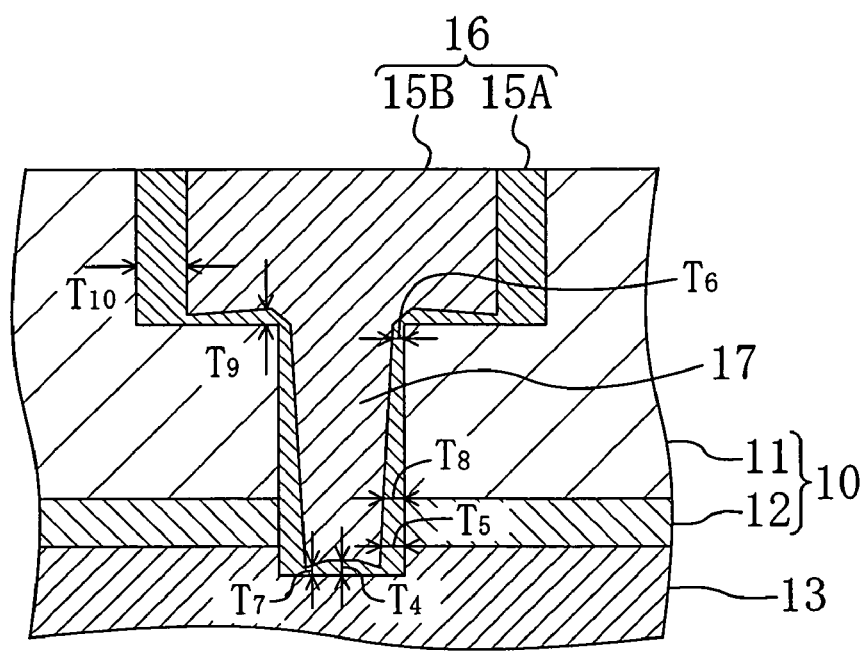
FIG. 2 is a sectional view showing a semiconductor device according to a second embodiment of the present invention.

Hereinafter, a semiconductor device and its fabrication method according to a second embodiment of the present invention will be described with reference to the accompanying drawings. FIG. 2 shows a cross-sectional structure of the semiconductor device with a barrier film according to the second embodiment.

Referring to FIG. 2, an insulating film 10 is formed on a lower interconnect 13 of Cu formed over a semiconductor substrate (not shown). The insulating film 10 includes: a metal diffusion prevention film 12 of silicon nitride (SiN) for preventing metal diffusion from the lower interconnect 13; and a low dielectric constant film 11 of SiOC.

An upper portion of the insulating film 10 is provided with an interconnect groove, and the bottom of the interconnect groove is provided with a via hole penetrating the insulating film 10 to expose the lower interconnect 13. Bottom and side surfaces of the interconnect groove and bottom and side surfaces of the via hole are covered with a barrier film 15A of Ta, and the interconnect groove and the via hole covered with the barrier film 15A are filled with a metal film 15B of Cu. With this structure, an upper interconnect 16 composed of the barrier film 15A and the metal film 15B is integrally formed with a via plug 17 composed of the barrier film 15A and the metal film 15B and electrically connecting the upper interconnect 16 to the lower interconnect 13.

In the second embodiment, the bottom surface of the via hole is positioned 20 nm below the interface between the lower interconnect 13 and the insulating film 10. The portion of the barrier film 15A covering the bottom surface of the via plug 17 is thicker in the center part than in the corner part, and the thickness $T_4$ of the center part is 3 nm. On the other hand, the portion of the barrier film 15A covering the side surface of the via plug 17 is thicker around the bottom surface of the via plug 17 than around the opening end thereof. The thickness $T_6$ of the portion of the barrier film 15A located around the opening end of the side surface of the via plug 17 is 1 nm, and the thickness $T_5$ of the portion of the barrier film 15A located at the interface between the lower interconnect 13 and the insulating film 10 is 6 nm. At least in the region below the interface between the lower interconnect 13 and the insulating film 10, the portion of the barrier film 15A covering that region of the via plug 17 is thicker on the side surface of the via plug 17 than on the bottom surface of the via plug 17.

With this structure, at the time at which a current flows between the via plug 17 and the lower interconnect 13, electric field concentration is eliminated on the minute region of the side surface of the via plug 17 where the via plug 17 is in contact with the lower interconnect 13. This allows preventing damages to the barrier film 15A and also preventing electromigration (EM) and resulting void creation in the metal film 15B.

Moreover, the mechanical strength of the barrier film 15A around the interface between the lower interconnect 13 and the insulating film 10 is also enhanced, which allows preventing damages to the barrier film 15A by physical stress generated at the interface between the lower interconnect 13 and the insulating film 10 due to the difference in thermal expansivity therebetween. Furthermore, stress migration and resulting void creation in the metal film 15B including the upper interconnect 16 can also be prevented.

Figure 3:
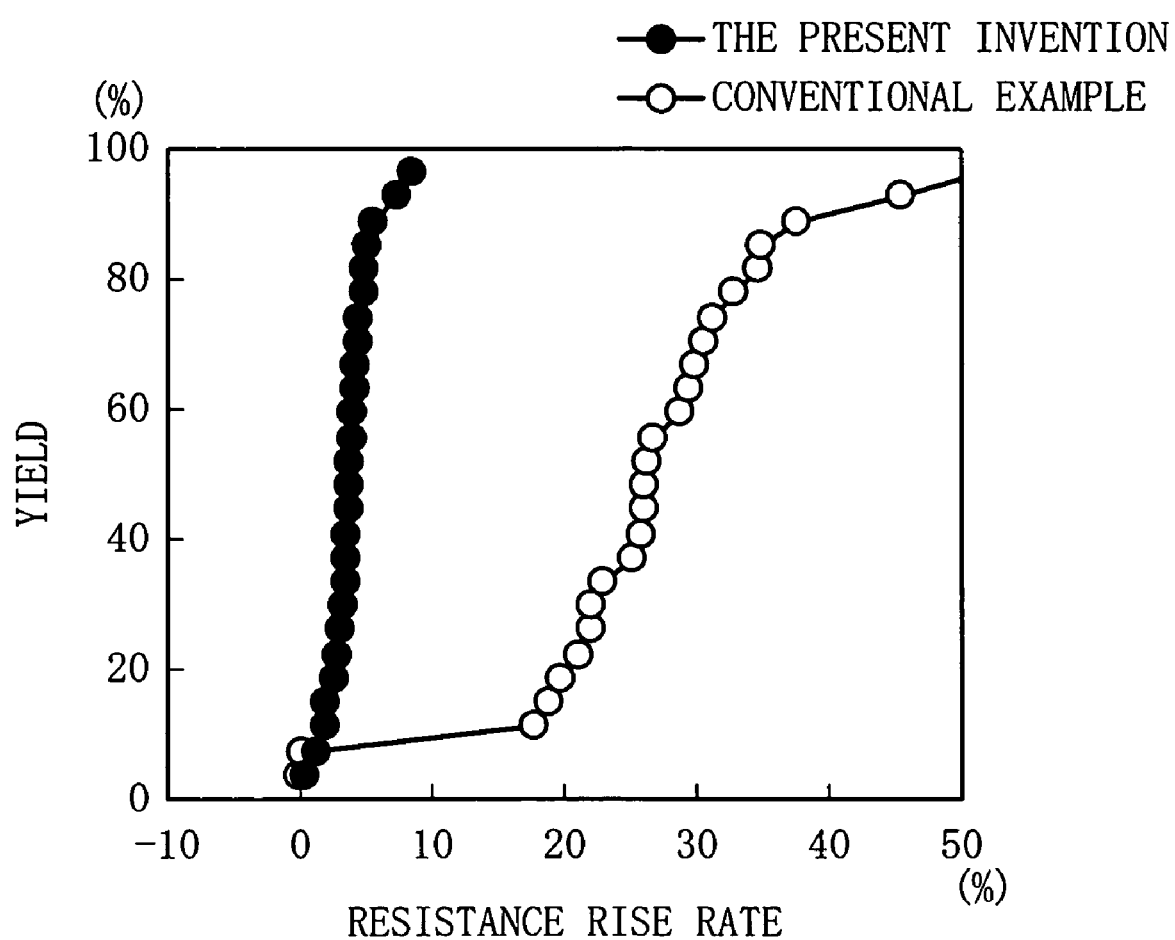
FIG. 3 is a graph showing the reliability of the semiconductor device according to the second embodiment of the present invention.

FIG. 3 shows the reliability of the semiconductor device of the second embodiment. In FIG. 3, the abscissa indicates the rise rate of the interconnect resistance in the case where a via chain is stored for 500 hours under a temperature condition of 200° C., and the ordinate indicates the yield thereof. As shown in FIG. 3, for the conventional semiconductor device, a sudden change was recognized in the rise rate of the interconnect resistance. This would conceivably arise because stress migration degrades the via plug 17. On the other hand, for the semiconductor device of the second embodiment in which the barrier film 15A is thicker on the side surface of the via plug 17 than on the bottom surface thereof, little change was recognized in the rise rate of the interconnect resistance. From this, it is considered that degradation of the via plug 17 hardly occurred.

Preferably, in the second embodiment, a portion of the barrier film 15A located on the side surface of the via plug 17 and at the interface between the metal diffusion prevention film 12 and the low dielectric constant film 11 also has the thickness $T_8$ greater than the thicknesses $T_4$ and $T_7$ of the portions of the barrier film 15A located on the bottom surface of the via plug 17. This allows preventing damages to the via plug 17 by physical stress generated at the interface between the metal diffusion prevention film 12 and the low dielectric constant film 11 due to the difference in thermal expansivity therebetween.

Preferably, the thickness $T_5$ of the portion of the barrier film 15A located at the interface between the lower interconnect 13 and the metal diffusion prevention film 12 is greater than the thickness $T_8$ of the portion of the barrier film 15A located at the interface between the metal diffusion prevention film 12 and the low dielectric constant film 11. This facilitates formation of a seed layer (not shown), which is for growing the metal film 15B, on the side surface of the via plug 17, and also facilitates filling of the via hole with the metal film 15B.

Like the first embodiment, the thickness $T_{10}$ of a portion of the barrier film 15A located on the side surface of the upper interconnect 16 is made greater than the thickness $T_9$ of a portion of the barrier film 15A located on the bottom surface of the upper interconnect 16, whereby the breakdown voltage between the adjacent upper interconnects 16 can be increased to further enhance the reliability of the semiconductor device.

In the second embodiment, Ta is used for the barrier film 15A. Alternatively, use may be made of a film of tantalum nitride (TaN), titanium (Ti), or titanium nitride (TiN), a stacked film of Ta and TaN, a stacked film of Ti and TiN, or the like. Further, Cu is used for the metal film 15B, and alternatively silver (Ag), tungsten (W), or the like can also be used therefor.

Hereinafter, a method for fabricating a semiconductor device according to the second embodiment of the present invention will be described. FIGS. 4A, 4B, 5A, 5B, and 6A through 6C are views showing cross-sectional structures of the semiconductor device in the order of its fabrication process steps according to the second embodiment.

Figure 4A:
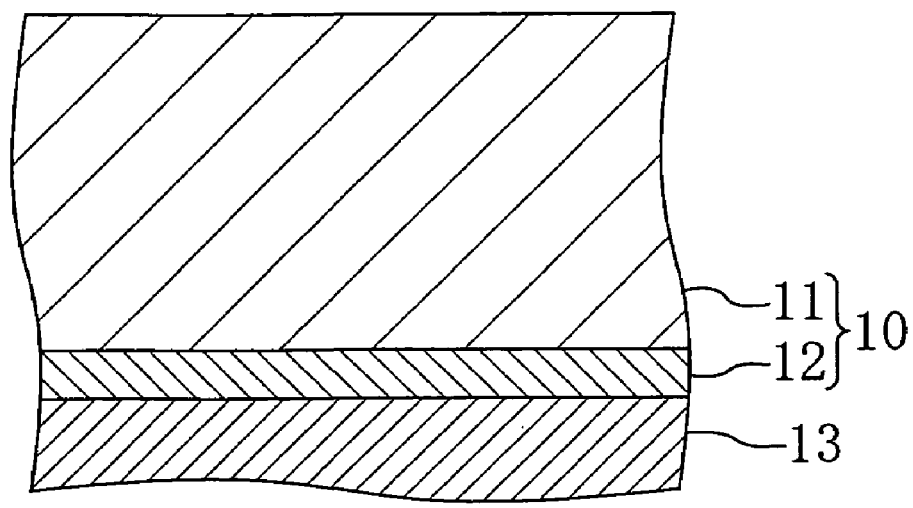
FIGS. 4A and 4B are sectional views showing fabrication steps for the semiconductor device according to the second embodiment of the present invention.

Referring to FIG. 4A, first, on the lower interconnect 13 of Cu formed over the semiconductor substrate (not shown), the insulating film 10 is formed which is composed of the metal diffusion prevention film 12 of SiN with a thickness of 60 nm and the low dielectric constant film 11 of SiOC with a thickness of 400 nm.

Figure 4B:
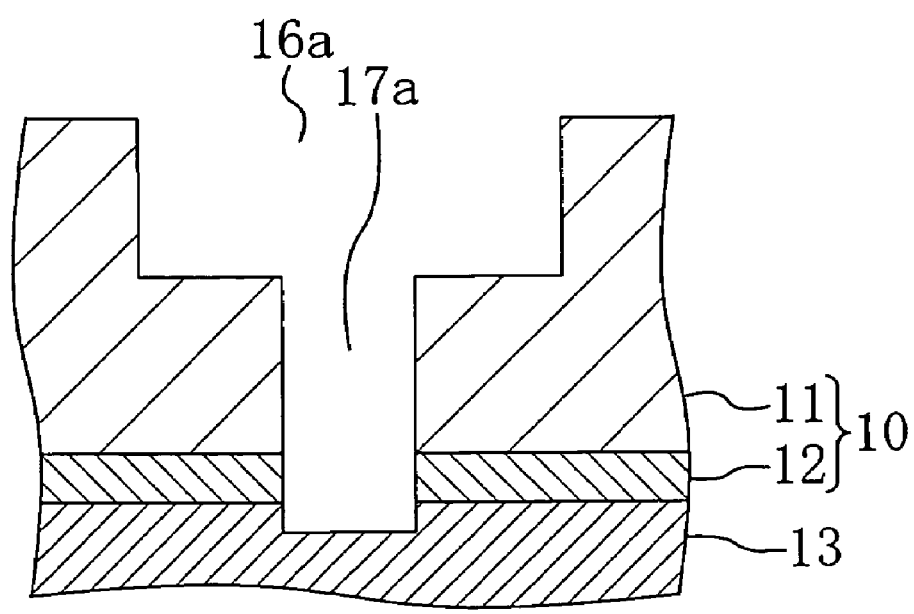

Next, as shown FIG. 4B, the insulating film 10 is etched to form an interconnect groove 16a with an aspect ratio of 2.5. The bottom of the interconnect groove 16a in the insulating film 10 is then etched, thereby forming a via hole 17a with an aspect ratio of 4.6 to expose the lower interconnect 13. During this etching, the lower interconnect 13 is also etched so that the bottom surface of the via hole 17a reaches 20 nm below the interface between the lower interconnect 13 and the insulating film 10.

Figure 5A:
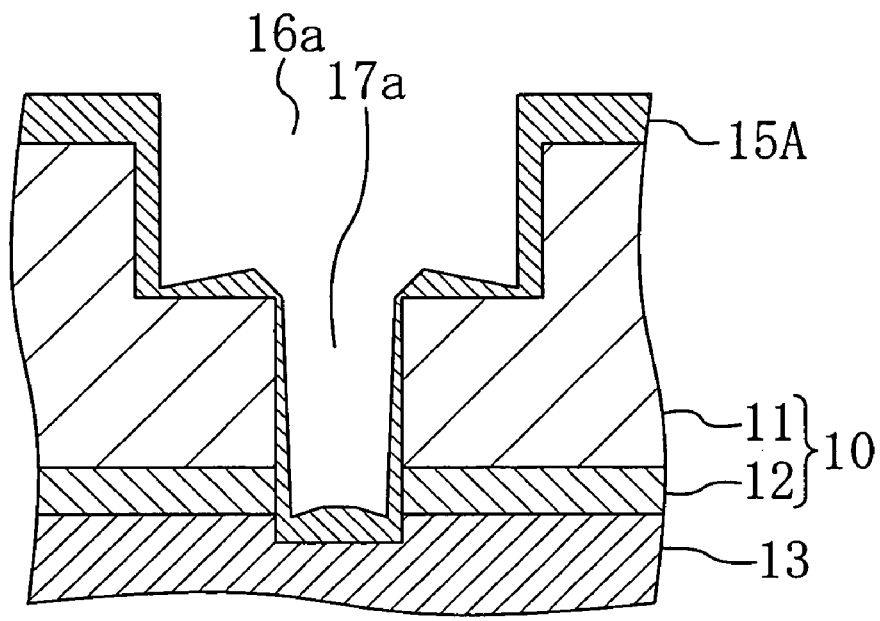
FIGS. 5A and 5B are sectional views showing fabrication steps for the semiconductor device according to the second embodiment of the present invention.

As shown in FIG. 5A, using a sputtering technique, the barrier film 15A of Ta is formed on the insulating film 10 including the interconnect groove 16a and the via hole 17a. In this step, the Ta sputtering is performed by applying a high-frequency power of 20 kW to a target electrode on the condition that argon gas (Ar) is used as a sputtering gas, the gas flow rate is set at 20 ml/min (1 atm, 0° C.), and the temperature is set at room temperature (25° C.). In this manner, the barrier film 15A is deposited which has thicknesses of 30 nm, 20 nm, 15 nm, 15 nm, and 1 nm on the top surface of the insulating film 10, the bottom surface of the interconnect groove 16a, the side surface of the interconnect groove 16a, the bottom surface of the via hole 17a, and the side surface of the via hole 17a, respectively.

Figure 5B:
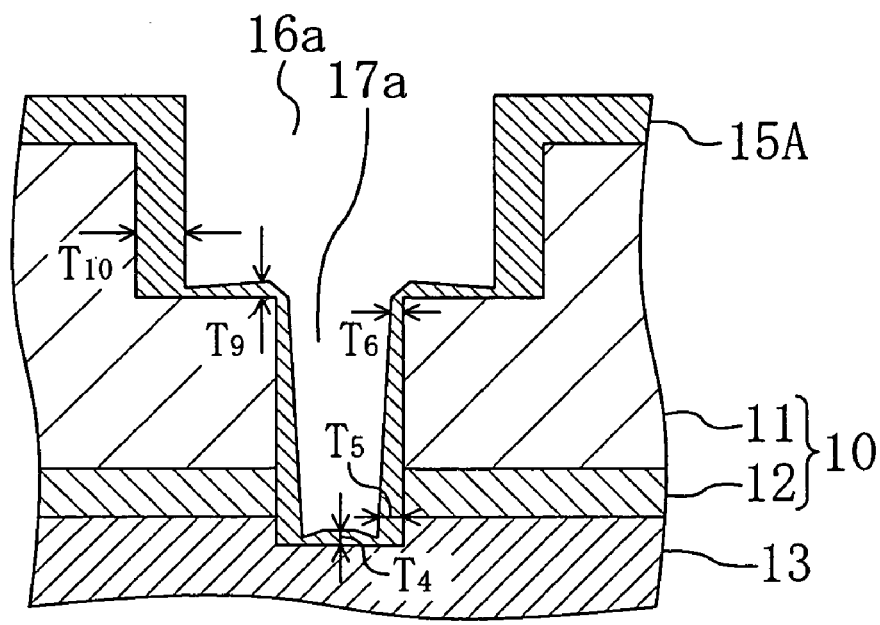

Subsequently, as shown FIG. 5B, resputtering is performed. Thereby, portions of the barrier film 15A deposited on the bottom surface of the interconnect groove 16a and the bottom surface of the via hole 17a are partly removed and let to adhere onto the barrier film 15A deposited on the side surface of the interconnect groove 16a and the side surface of the via hole 17a, respectively. Thus, the thickness $T_9$ of the portion of the barrier film 15A covering the bottom surface of the interconnect groove 16a is made smaller than the thickness $T_{10}$ of the portion of the barrier film 15A covering the side surface of the interconnect groove 16a. Also, the thickness $T_4$ of the portion of the barrier film 15A located at the center portion of the bottom surface of the via hole 17a is made smaller than the thickness $T_5$ of the portion of the barrier film 15A located on the side surface of the via hole 17a and at the interface between the lower interconnect 13 and the insulating film 10.

In the second embodiment, resputtering is performed on the condition of a target bias power of 500 W, a substrate bias power of 400 W, and a high-frequency coil power of 1200 W. In this manner, the portion of the barrier film 15A covering the bottom surface of the interconnect groove 16a is formed to have a thickness $T_9$ of 10 nm, and the portion thereof covering the side surface of the interconnect groove 16a is formed to have a thickness $T_{10}$ of 20 nm. The portion of the barrier film 15A covering the bottom surface of the via hole 17a is formed to have a thickness $T_4$ of 3 nm. Further, in the barrier film 15A covering the side surface of the via hole 17a, a portion at the interface between the lower interconnect 13 and the insulating film 10 is formed to have a thickness $T_5$ of 6 nm, and a portion at the top end of the via hole 17a is formed to have a thickness $T_6$ of 1 nm.

Figure 6A:
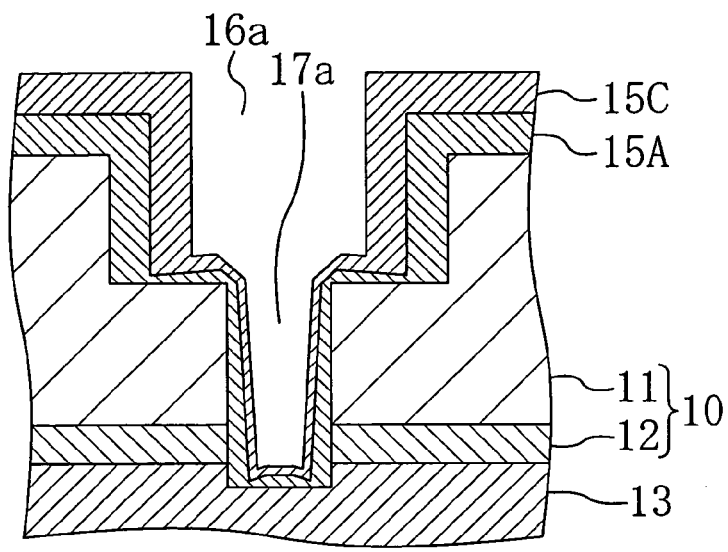
FIGS. 6A through 6C are sectional views showing fabrication steps for the semiconductor device according to the second embodiment of the present invention.

As shown in FIG. 6A, by a sputtering technique, a seed layer 15C of Cu with a thickness of 80 nm is formed on the barrier film 15A. In this formation, since the portion of the barrier film 15A covering the side surface of the via hole 17a is thicker on the lower region of the via hole 17a than on around the opening end of the via hole, the barrier film 15A has a tapered shape. Thus, the seed layer 15C can be formed easily on the bottom surface of the via hole 17a.

Figure 6B:
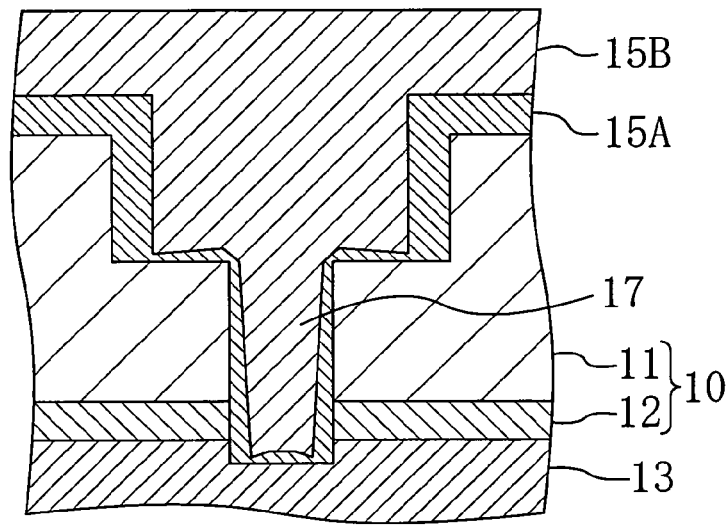

Then, as shown in FIG. 6B, using an electrolytic plating technique, the via hole 17a and the interconnect groove 16a are filled with the metal film 15B of Cu.

Figure 6C:
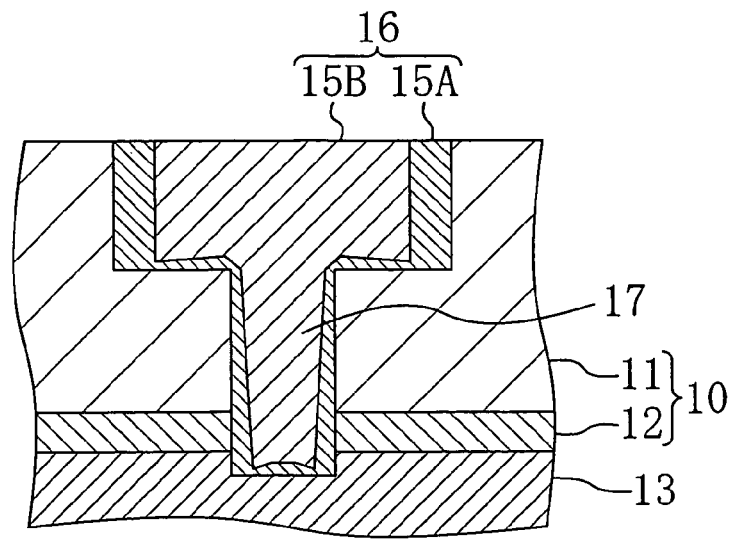

Subsequently, as shown in FIG. 6C, by a chemical mechanical polishing (CMP) technique, portions of the metal film 15B and the barrier film 15A extending off the interconnect groove 16a are removed to integrally form the upper interconnect 16 and the via plug 17 for electrically connecting the upper interconnect 16 and the lower interconnect 13.

Note that the sputtering and resputtering conditions can be changed as appropriate according to the aspect ratios of the interconnect groove 16a and the via hole 17a, the material of the barrier film 15A, the thickness of the barrier film 15A to be formed, and the like. The second embodiment shows the exemplary procedure in which sputtering and resputtering are each performed once. Alternatively, another exemplary procedure may be employed in which resputtering is performed to thicken the barrier film covering the side surface and then sputtering is performed again to adjust the thickness of the barrier film 15A covering the bottom surface. As still another exemplary procedure, sputtering and resputtering may be performed alternately.

In the second embodiment, resputtering is exemplarily performed simultaneously on the portions of the barrier film 15A formed in the interconnect groove 16a and the via hole 17a. Alternatively, resputtering may be performed separately. Moreover, the upper interconnect 16 and the via plug 17 are exemplarily formed integrally. Alternatively, no via plug 17 but only the upper interconnect 16 may be formed. Another exemplary procedure may be performed in which the via plug 17 is formed and then the upper interconnect 16 is formed.

Sputtering is employed in the formation step of the seed layer 15C shown in FIG. 6A, and alternatively chemical vapor deposition (CVD) may be employed therein. Electrolytic plating is employed in the filling step of the metal film 15B shown in FIG. 6B, and alternatively electroless plating may be employed therein.

THIRD EMBODIMENT

Figure 7:
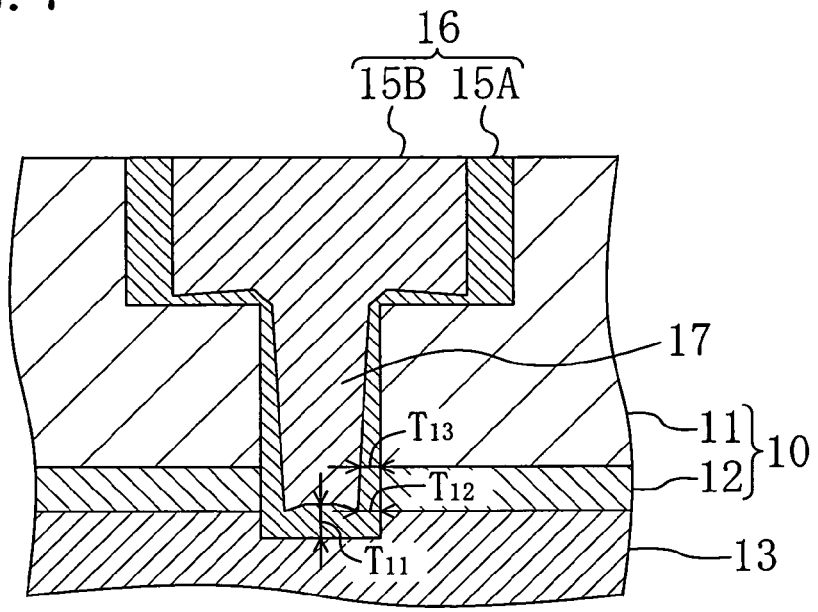
FIG. 7 is a sectional view showing a semiconductor device according to a third embodiment of the present invention.
Figure 8:
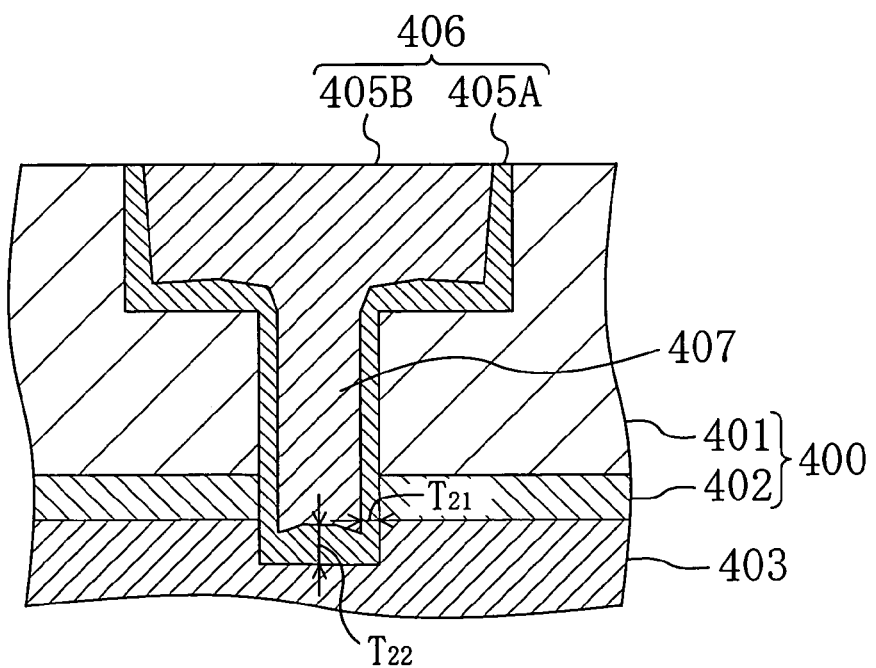
FIG. 8 is a sectional view showing a semiconductor device according to a conventional example.

A semiconductor device according to a third embodiment of the present invention will be described with reference to the accompanying drawings. FIG. 7 shows a cross-sectional structure of the semiconductor device with a barrier film according to the third embodiment.

Referring to FIG. 7, an insulating film 10 is formed on a lower interconnect 13 of Cu provided over a semiconductor substrate (not shown). The insulating film 10 includes: a metal diffusion prevention film 12 of SiN for preventing metal diffusion from the lower interconnect 13; and a low dielectric constant film 11 of SiOC. The bottom of an interconnect groove formed in the insulating film 10 is provided with a via hole penetrating the insulating film 10 to expose the lower interconnect 13.

Bottom and side surfaces of the interconnect groove and bottom and side surfaces of the via hole are covered with a barrier film 15A of Ta, and the interconnect groove and the via hole covered with the barrier film 15A are filled with a metal film 15B of Cu. With this structure, an upper interconnect 16 composed of the barrier film 15A and the metal film 15B is integrally formed with a via plug 17 composed of the barrier film 15A and the metal film 15B and electrically connecting the upper interconnect 16 to the lower interconnect 13.

In the third embodiment, the bottom surface of the via hole is positioned 3 nm below the interface between the lower interconnect 13 and the insulating film 10. The thickness $T_{11}$ of a portion of the barrier film 15A located on the bottom surface of the via plug 17 is 12 nm at the center part of the bottom surface of the via plug 17, so that the top surface of the portion of the barrier film 15A covering the bottom surface of the via plug 17 is positioned above the interface between the lower interconnect 13 and the insulating film 10.

As shown above, since the portion of the barrier film 15A located on the bottom surface of the via plug 17 is thickened, no thin portion of the barrier film 15A is present in an area where the via plug 17 is in contact with the lower interconnect 13. With this structure, at the time at which a current flows between the via plug 17 and the lower interconnect 13, electric field concentration is eliminated on the minute region of the side surface of the via plug 17. This allows preventing degradation of the via plug 17 due to electromigration.

Moreover, the via hole 17a is filled with the barrier film 15A to the height above the interface between the lower interconnect 13 and the insulating film 10, which allows preventing damages to the via plug 17 by physical stress generated at the interface between the lower interconnect 13 and the insulating film 10 due to the difference in thermal expansivity therebetween.

Preferably, in the third embodiment, the portion of the barrier film 15A located on the bottom surface of the via plug 17 has a thickness of 20 nm or smaller. The reason of this is that an increase in the thickness of the portion of the barrier film 15A located on the bottom surface of the via plug 17 raises the contact resistance between the via plug 17 and the lower interconnect 13.

The portion of the barrier film 15A formed on the side surface of the via plug 17 is made thicker at the bottom corner of the via plug than at the top end thereof, which provides the barrier film 15A in a tapered shape. Therefore, a seed layer (not shown) can be formed easily on the bottom surface of the via hole 17a.

Preferably, the portion of the barrier film 15A located on the side surface of the via plug 17 and at the interface between the metal diffusion prevention film 12 and the low dielectric constant film 11 has the thickness $T_{13}$ greater than the thickness $T_{11}$ of the portion thereof located on the bottom surface of the via plug 17. This allows preventing damages to the via plug 17 by physical stress generated at the interface between the metal diffusion prevention film 12 and the low dielectric constant film 11 due to the difference in thermal expansivity therebetween.

Preferably, the portion of the barrier film 15A located at the interface between the lower interconnect 13 and the metal diffusion prevention film 12 has the thickness $T_{12}$ greater than the thickness $T_{13}$ of the portion thereof located at the interface between the metal diffusion prevention film 12 and the low dielectric constant film 11. This facilitates formation of the seed layer (not shown) on the side surface of the via plug 17, and also facilitates filling of the via hole with the metal film 15B.

In the third embodiment, Ta is used for the barrier film 15A. Alternatively, use may be made of a film of tantalum nitride (TaN), titanium (Ti), or titanium nitride (TiN), a stacked film of Ta and TaN, a stacked film of Ti and TiN, or the like. Further, Cu is used for the metal film 15B, and alternatively silver (Ag), tungsten (W), or the like can also be used therefor.

As is apparent from the above, the semiconductor device and its fabrication method according to the present invention have the effect of preventing damages to the interconnect and the via plug due to electric field concentration and physical stress to provide a long-lasting, highly-reliable semiconductor device and its fabrication method. Therefore, they are useful as a semiconductor device with a barrier film and its fabrication method.

What is claimed is:

1. A semiconductor device comprising:
   a lower interconnect formed over a semiconductor substrate;
   an insulating film formed on the lower interconnect; a via hole penetrating the insulating film to reach the lower interconnect;
   a first barrier film covering bottom and side surfaces of the via hole; and
   a metal film filling the via hole covered with the first barrier film,
   wherein a portion of the first barrier film covering a region of the side surface of the via hole located below an interface between the insulating film and the lower interconnect is thicker than a portion of the first barrier film covering the bottom surface of the via hole.

2. The device of claim 1, further comprising:
   an interconnect groove formed in an upper portion of the insulating film to have a bottom surface where an opening end of the via hole is positioned;
   a second barrier film covering bottom and side surfaces of the interconnect groove; and
   a second metal film filling the interconnect groove covered with the second barrier film.

3. The device of claim 2,
   wherein a portion of the second barrier film covering the side surface of the interconnect groove is thicker than the portion thereof covering the bottom surface of the interconnect groove.

4. The device of claim 2,
   wherein the first and second barrier films are integrally formed of the same material, and the first and second metal films are integrally formed of the same material.

5. The device of claim 1,
   wherein the insulating film includes:
   a diffusion-prevention insulating film formed on the lower interconnect; and
   a low dielectric constant film formed on the diffusion-prevention insulating film, and
   a portion of the first barrier film covering a region of the side surface of the via hole located below the interface between the diffusion-prevention insulating film and the low dielectric constant film is thicker than the portion thereof covering the bottom surface of the via hole.

6. A semiconductor device comprising:
   a lower interconnect formed over a semiconductor substrate;
   an insulating film formed on the lower interconnect;
   a via hole penetrating the insulating film to reach the lower interconnect;
   a barrier film covering bottom and side surfaces of the via hole; and
   a metal film filling the via hole covered with the barrier film,
   wherein the bottom surface of the via hole is positioned below the interface between the lower interconnect and the insulating film, and a top surface of a portion of the barrier film covering the bottom surface of the via hole is positioned above the interface between the lower interconnect and the insulating film.

7. The device of claim 6,
   wherein a portion of the barrier film covering a lower end of the side surface of the via hole is thicker than a portion thereof covering the bottom surface of the via hole.

* * * * *

UNITED STATES PATENT AND TRADEMARK OFFICE
CERTIFICATE OF CORRECTION

| | |
|---|---|
| PATENT NO. | : 7,564,133 B2 |
| APPLICATION NO. | : 11/396645 |
| DATED | : July 21, 2009 |
| INVENTOR(S) | : Masakazu Hamada et al. |

It is certified that error appears in the above-identified patent and that said Letters Patent is hereby corrected as shown below:

ON THE TITLE PAGE:

In Item "(73) Assignee", change "Renesas Technology, Corp." to

--Renesas Technology Corp.--

Signed and Sealed this

Third Day of November, 2009

David J. Kappos
*Director of the United States Patent and Trademark Office*